United States Patent [19]

Corda

[11] Patent Number: 4,931,847
[45] Date of Patent: Jun. 5, 1990

[54] FLOATING GATE MEMORY WITH SIDEWALL TUNNELLING AREA

[75] Inventor: Giuseppe Corda, Saronno, Italy

[73] Assignee: SGS-Thomson Microelectronics S.p.A., Italy

[21] Appl. No.: 379,706

[22] Filed: Jul. 14, 1989

Related U.S. Application Data

[63] Continuation of Ser. No. 64,378, Jun. 22, 1987, abandoned.

[30] Foreign Application Priority Data

Jun. 27, 1986 [IT] Italy .............................. 83629 A/86

[51] Int. Cl.$^5$ ...................... H01L 27/04; H01L 29/78; G11C 11/40
[52] U.S. Cl. .................................. 357/23.5; 357/23.3; 365/185
[58] Field of Search ...................... 357/23.5, 59 J, 233; 365/185

[56] References Cited

U.S. PATENT DOCUMENTS

| | | | |
|---|---|---|---|
| 4,132,904 | 1/1979 | Harari | 357/42 |
| 4,477,825 | 10/1984 | Yaron et al. | 357/23.5 |
| 4,608,585 | 8/1986 | Keshtbod | 357/23.5 |
| 4,701,776 | 10/1987 | Perlegos et al. | 357/23.11 |
| 4,754,320 | 6/1988 | Mizutani et al. | 357/23.5 |

Primary Examiner—William D. Larkins
Attorney, Agent, or Firm—Pollock, Vande Sande & Priddy

[57] ABSTRACT

The tunnelling area of a EEPROM memory device of the FLOTOX type is efficiently reduced in respect of the minimum areas obtained by means of current fabrication technologies, by forming the injection zone for the transfer of the electric charges by tunnel effect to an from the floating gate through an original self-aligned process, which allows to limit the dimensions of such a tunnelling area independently from the resolution limits of the available photolithographic technology.

11 Claims, 2 Drawing Sheets

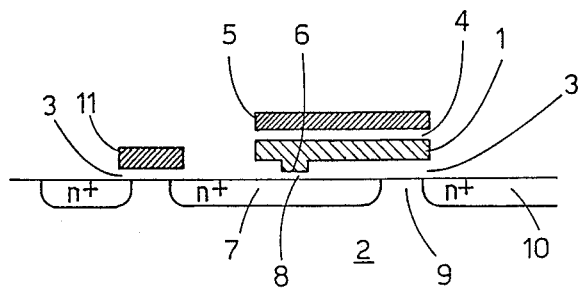
FIG. 1
(Prior art)
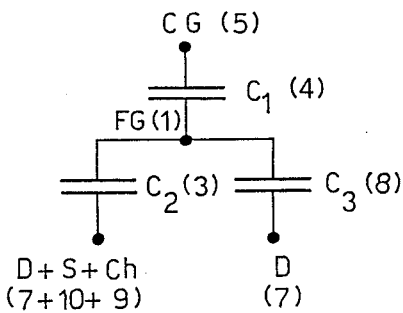
FIG. 2
(Prior art)
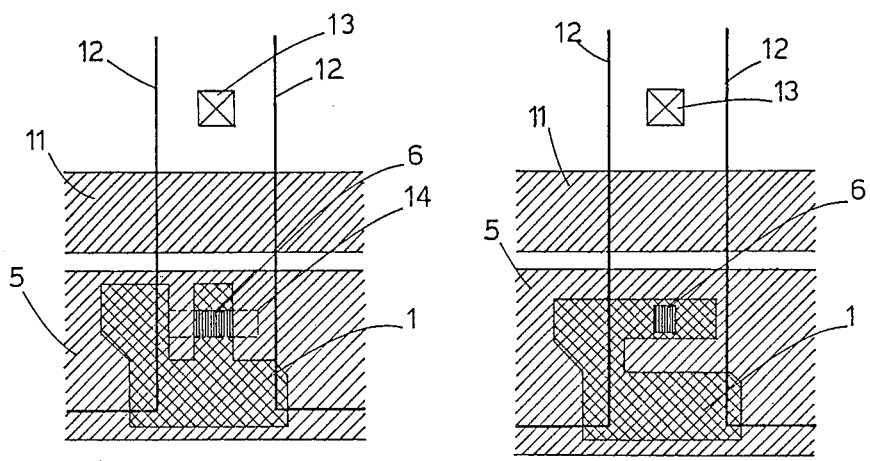
FIG. 3
(Prior art)
FIG. 4
(Prior art)

FLOATING GATE MEMORY WITH SIDEWALL TUNNELLING AREA

This application is a continuation, of Ser. No. 07/064,378 filed on June 22, 1987, now abandoned.

This invention relates, in general, to semi-conductor memory devices and more particularly, to electrically alterable, read-only memory devices, of the floating gate type, utilized in microprocessor based systems, in dedicated nonvolatile memories, in TV channel selectors and in other comparable systems.

Microprocessor - based systems and related arts, increasingly need read-only memory elements which can be altered by electrical means, i.e. memory elements which although being able to retain data written thereon for relatively long periods of time (several years), offer the possibility of erasing and rewriting (reprogramming) all or some of the data contained therein by electrical means and essentially without needing to remove the microcircuit containing them from the apparatus for subjecting it to erasing treatments (preceding an eventual, necessarily total reprogramming) contemplating irradiation as it was necessary with the read-only memory devices of the FAMOS type, from "Floating Gate Avalanche Metal Oxide Semiconductor".

Lately, the art has progressed to the point where a number of nonvolatile memory devices, electrically alterable, have been successfully produced. Microprocessors or systems incorporating such memory device equally known as EE-PROM from "Electrically Erasable - Programmable Read-Only Memory" or as EA-PROM from "Electrically Alterable Programmable Read-Only Memory", offer the great advantage, in respect to the devices of the prior art, of allowing both the erasing and rewriting of single bytes or the erasing of all the stored data.

The memory cell, that is the basic integrated semiconductor structure of such devices, is the so-called FLOTOX cell, from "Floating Gate Tunnel Oxide", which is described in detail in an article entitled: "16-J-EE-PROM Relies on Tunnelling for Byte-Erasable Program Storage" by W. S. Johnson et al., "Electronics" of Feb. 28, 1980, pages 113–117. In this article, the author describes a FLOTOX structure where a cell utilizing a polycrystalline silicon floating gate structure, has such a structure charged with electrons (or holes) through a suitable "window" providing a thin layer of oxide between said floating gate structure and the monocrystalline silicon in correspondence to the drain region, by a Fowler-Nordheim tunnelling mechanism. That is, the mechanism exploited for trapping the charge in a floating gate electrode is conduction by tunnel effect of electrons (or holes) through a thin oxide dielectric layer caused by sufficiently high electric fields, generally over at least 10 MV/cm.

Understanding the prior art and its drawbacks, as well as the description of the FLOTOX cell object of the present invention, will be easier and more immediate by referring to a series of drawings annexed to the present specification, wherein:

FIG. 1 is a schematic, elevation cross sectional view of the structure of a FLOTOX memory cell of the conventional type;

FIG. 2 is a diagram of the relevant capacitive couplings of the FLOTOX structure of FIG. 1;

FIG. 3 is a schematic plan view of an elementary FLOTOX memory cell so as practically made on a semiconductor chip, according to a known method of fabrication;

FIG. 4 is a schematic plan view of an elementary FLOTOX memory cell as fabricated according to another known method, alternative to that of FIG. 3;

Figure 5:
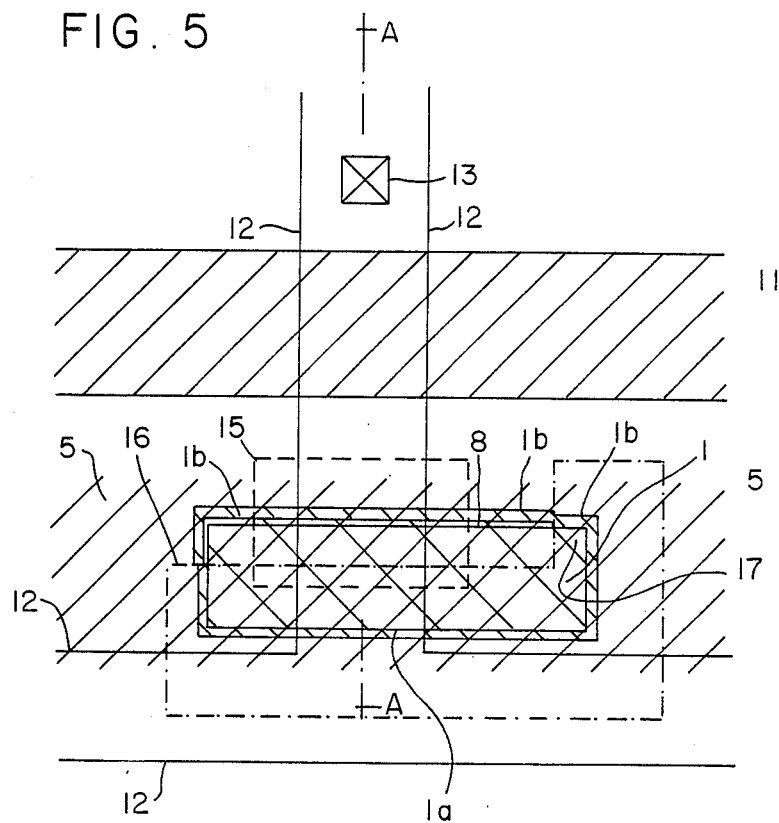
FIG. 5 is a schematic plan view of an elementary FLOTOX memory cell made in accordance with the present invention.

As schematically shown in FIG. 1, a typical configuration of a FLOTOX cell comprises a first level or layer of polycrystalline silicon 1, completely insulated, which constitutes the floating gate electrode. It is insulated from the monocrystalline silicon 2 by the layer of gate oxide 3, it extends over a channel region 9 of the MOS device which is comprised between a source region 10 and a drain region 7, and, for a certain distance, over this latter region. An insulating layer 4 of silicon oxide or of an equivalent dielectric, thermally grown or deposited by chemical vapor deposition (CVD), insulates the first level polycrystalline silicon 1 from a second level of polycrystalline silicon 5, which constitutes the so-called control gate electrode. An appropriate write/erase "window" 6 is present in the gate oxide layer 3 for the transfer of electric charges by a tunnelling mechanism to the floating gate 1, in correspondence of the drain region 7 of the MOS device. In correspondence of said window, the insulation between the floating gate and the silicon is represented by an extremely thin layer of silicon oxide 8, called tunnel oxide, whose thickness is normally less than 100 Å, in respect of the normal thickness of the gate oxide 3, which is typically greater than 250 Å and of the thickness of the insulating layer 4, which is typically greater than 200 Å.

In FIG. 1, is also represented the line selection or select transistor formed in series with the real memory cell, and whose gate is also known as "transfer gate".

The principle of operation of this memory cell is well known: electrons may be injected into the floating gate by applying an appropriate electric field between the same floating gate and the drain of the memory device; such an electric field is applied by means of a capacitive coupling through the control gate, the floating gate being unaccessible. Electrons may be removed from the floating gate by applying an electric field of opposite sign again between the floating gate and the drain: this is obtained by connecting the control gate to ground and imposing on the drain of the memory element a positive voltage by means of the transfer gate.

One of the most important technical problems encountered in realizing such memory cells concerns the definition of the tunnelling area, i.e. of the thin oxide "window" for the transfer of the electric charges from and to the floating gate. It is, in fact, necessary to strive to make this area as small as possible for two reasons.

The memory element may be diagrammatically represented as a capacitor network shown in FIG. 2. Essentially, the memory element, that is the floating gate (FG), is capacitively coupled, through the capacitance $C_1$ of the dielectric layer 4, to the control gate (CG) 5; through the capacitance $C_2$ of the gate oxide 3, to the semiconductor material of the drain (D), source (S) and channel (Ch) regions, i.e. to regions 7, 10 and 9; and through the capacitance $C_3$ of the tunnel oxide 8, to the drain (D) region 7. The potential which the floating gate of the memory device may reach, depends, obviously, upon the values of the voltages imposed between the control gate and the drain of the device; upon its capacitive coupling and upon the stored electric charge. Through appropriate considerations, one establishes that the potential reachable by the floating gate is given by:

$$V_{FG} = \alpha V_{CG} \text{ where } \alpha = \frac{C_1}{C_1 + C_2 + C_3}$$

In order to minimize the voltages to be applied to the device for modifying its state; i.e. for effecting "WRITE" and "ERASE" operations, it is advantageous that the value of $C_3$ be as low as possible: in consideration of the fact that the tunnel oxide must necessarily be extremely thin in order to be able to obtain through its thickness extremely intense electric fields (in the order of 10 MV/cm) so that the electric charges may overcome the energy barrier by the tunnelling mechanism, it is the tunnelling area which must be reduced as much as possible for keeping low the value of $C_3$ and therefore for maximizing the constant $\alpha$. Reducing the tunnel area is advantageous also for other reasons. The extremely thin dielectric layer of tunnel oxide, which is, as mentioned, subject to extremely high electric fields, undergoes a well known wear-out phenomenon, i.e. the oxide tends to deteriorate after a certain number of write and erase cycles. Such a phenomenon takes place because, even utilizing the most accurate techniques for forming such a thin layer of dielectric, it is impossible to avoid having its surface be completely exempt from lattice defects, which become a cause of the wear-out phenomenon. Therefore, reducing the size of the tunnelling area means, on the other hand, increasing the probability that such a small area be free of defects.

According to the known technique, the definition of the tunnel oxide area and its formation are, generally, carried out in the ways shown schematically in FIGS. 3 and 4.

FIGS. 3 and 4, represent plan views of a FLOTOX memory cell as schematically shown in FIG. 1, the identifying numbers of which are also used in FIGS. 3 and 4 for identifying the same parts. The "T" outline, indicated by the thick lines 12, defines the active area of an elementary memory cell, that is the area not covered by the field oxide. In both FIGS. 3 and 4, an area 13 is also shown, which is dedicated for the "column" electric connection of the elementary FLOTOX cell in a customary memory matrix made up of a large number of cells arranged in an array of lines and columns.

According to the fabrication process of the elementary memory cell of FIG. 3, the tunnel oxide area 6 is defined by the crossing over of two masks; i.e. of the mask used for defining the first level of polycrystalline silicon 1 (floating gate) and of a mask utilized for "opening" the gate oxide in an area shown with the dash line 14, over which the tunnel oxide will be grown.

According to another technology, shown in FIG. 4, the tunnelling area 6 is defined by an appropriate mask which determines the window through which the gate oxide will be attacked until the underlying is exposed before growing the tunnel oxide over this area.

Both the techniques shown in FIGS. 3 and 4, as well as other techniques similar to these, have the drawback of being limited by the definition and alignment characteristic of the particular photolithographic technique used or available. On the other hand, the necessity to reduce as much as possible the tunnel area induces working at the limit of definition with the result of imposing serious control and reproducibility problems on the fabrication process without obtaining decisively satisfactory results in terms of minimizing the tunnelling area.

From this, the tendency to use, for defining the tunnelling area, photolithographic technologies more advanced in respect to those normally used for all other layers of the integrated circuit, creating even more complex problems of compatibility among the different apparatuses used in the fabrication process.

There is, therefore, a clear necessity or utility to have a FLOTOX cell for EEPROM type memories which has minimal dimensions of the tunnelling area and which may be easily fabricated without requiring particularly sophisticated photolithographic technologies.

Such objectives and advantages are obtained through the nonvolatile, semiconductor, memory device of the floating gate type (also known as FLOTOX cell) having a new configuration and structure. The structure of the FLOTOX cell of the invention is such as to make it possible to minimize the tunnelling area independently of the limitations of the particular photolithographic technology utilized for defining the areas, allowing to define the extent of the tunnelling area by controlling essentially noncritical parameters of the fabrication process.

Differently from the FLOTOX cells of the known type, the cell of the invention no longer presents a tunnelling area, defined within a much larger superimposed zone of the floating gate over the drain region of the MOS device, but, in correspondence of the floating gate edge toward the drain region of the device, and after having removed the gate oxide and formed a layer of tunnel oxide over a sufficiently extended area containing at least a length of such an edge, an appendix (or seam) of polycrystalline silicon suitably electrically connected to the floating gate is formed. The lower base of such a seam of polycrystalline silicon results in being insulated from the monocrystalline silicon by the layer of tunnel oxide. Such an appendix or seam, formed along the edge of the floating gate, may advantageously be formed by a so-called "self-aligned" process which does not require any critical mask and the "width" of the base of such a seam, which determines the tunnelling area, may be easily determined by controlling the conditions under which an anisotropic attack of an appropriate layer or multilayer of matrix polycrystalline silicon, previously deposited on the surface of the wafer being processed, is conducted.

A further advantage of the particular configuration of the cell object of the present invention, is represented by the fact that being no longer necessary to provide an adequately large superimposed zone between the polycrystalline silicon of the first level (floating gate) and the drain region of the device, it is possible to further reduce the total area occupied by a single memory cell, i.e. making more compact cells.

Figure 6:
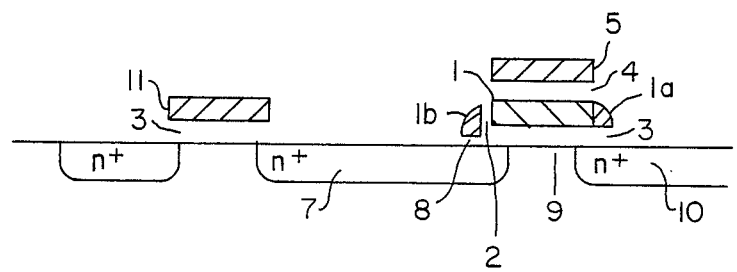
FIG. 6 is a schematic elevation cross section of the elementary FLOTOX memory cell of the present invention.

The FLOTOX cell of the invention, as well as the fabrication process therof, will be more easily understood through the illustration of a particularly preferred embodiment of the invention itself and with reference to FIGS. 5 and 6.

Referring to FIGS. 5 and 6, wherein the same numbers are used for indicating parts corresponding or similar to those to the structures depicted in the preceding figures described in connection of the prior art discussion, the FLOTOX cell of the invention comprises, similarly to the cells of the prior art, a first level of polycrystalline silicon 1 (briefly poly 1), shown in the figures by a specific hatching and insulated from the surface of the semiconducting material by the dielectric layer of gate oxide, and which constitutes the memory element; i.e. the floating gate of the device.

Such a first layer or level of poly is placed over a channel region 9 of the semiconducting material chip 2 and extends laterally by a certain distance over the surrounding field oxide which defines the active area of the elementary cell indicated by the thick lines 12 in FIG. 5.

Preferably, the MOS device is an n-channel, i.e. the channel region 9 is created at the surface of a semiconducting monocrystal, e.g. of silicon, with a p-type conductivity i.e. of silicon doped with acceptor type impurities (e.g. boron).

The source 10 and drain 7 regions of the device will be customarily made by means of a heavy implantation and diffusion of donor type impurities (e.g. phosphorus or arsenic).

By means of an appropriate noncritical mask, whose outline may be the one indicated with a dash line 15 in FIG. 5, the gate oxide, previously formed on the surface of the silicon before depositing and defining the first level of poly 1, is removed until the silicon within the area comprised inside such an outline 15 and not covered by the first layer or level of poly 1 is exposed again. Subsequently, by heat oxidation under particularly stringent conditions of freedom from contaminants, the thin layer of tunnel oxide 8 is formed, which naturally will form also over the upper surface and over the vertical edges of the first layer of poly 1.

By means of another mask (also of noncritical character), whose outline may be that indicated with a dash/-dot line 16 of FIG. 5, and preferably after having deposited a first matrix layer of about 500 Å of polycrystalline silicon, both the matrix layer of poly and the layer of tunnel oxide which was formed previously are removed within the area defined by the mask.

A second matrix layer of polycrystalline silicon with a uniform thickness, which is preferably comprised between 4000 and 5000 Å, is deposited over the whole surface of the device, which second layer, within the areas where the tunnel oxide was previously removed, will be deposited directly over the surface of the first level poly 1 and, therefore, in a condition of electrical continuity in respect of the latter.

As in a so-called self-aligned fabrication process, a strongly anisotropic attack, e.g. a RIE attack (from Reactive Ion Etching), conducted until a complete removal of the whole thickness of the layer or of the layers of matrix polycrystalline silicon (500+4000 or 5000 Å), will determine the formation of an appendix or seam (which may also be referred to as "spacer" for analogy with such seams or spacers of dielectric materials formed in the so-called self-aligned processes) 1a and 1b of polycrystalline silicon along the edges of the first level poly 1.

While such a seam (1a and 1b in the figures) will be continuous, it will be separated from the first level of poly 1 by the layer of tunnel oxide 8 (which further insulates it from the silicon as visible in FIG. 6) in correspondence to the edge of the floating gate 1 adjacent to the drain region 7 of the device; while, in correspondence to the edge of the floating gate 1 adjacent to the source region 10, the same seam of poly will be formed directly over the edge of the pre-existing first level of poly 1, having, as previously described, removed the thin layer of tunnel oxide from the area defined by the mask 16 (FIG. 5).

In this way, also the length of seam 1b formed over the edge of the floating gate 1 adjacent to the drain region 7, whose base surface, that is its width, determines the extent of the tunnelling area, results in being electrically connected to the pre-existing portion of the floating gate, represented by the first level of poly 1. In fact, at least within the superimposition zone of the poly over the field oxide on the right hand side of FIG. 5, the seam of poly 1b will be directly in contact with the first level poly 1, at least along the length indicated with 17.

Obviously, other methods may be used for ensuring the electrical continuity between the two portions forming the floating gate of the device, i.e. between the first poly 1, that is the real floating gate of the device, which overlies essentially the channel region 9, and the appendix (1a, 1b) formed along the edges of such first layer of poly 1, which, in correspondence to the superimposed zone (length 1b) with the drain region 7, constitutes the necessary tunnelling area for the trasfer of electric charges to and from the floating gate composite structure.

By utilizing modern deposition techniques of the polycrystalline silicon to form said first and second matrix layer and of RIE attack for removing them under conditions of strongly anisotropic attack, the width of the base of said seam (1a, 1b) comprised between 0.2 and 0.5 μm is easily obtainable and, by choosing for example to form a seam with base width of 0.3 μm, it is easy to obtain a tunneling area of $0.3 \times 1.5 = 0.45$ μm$^2$ (in the case of a width of the active area occupied by the memory element of 1.5 μm, as it is current practice).

According to the known structures of the FLOTOX cell, a similar result would require a 0.7 μm technology; i.e. a technology with a definable minimum width of 0.7 μm and, therefore, an extremely sophisticated photolithographic technology, using X-rays instead of U.V. light.

The advantages and optimization possibilities during the design phase offered by the cell or memory device of the present invention are multiple, by virtue of the fact that to such a reduction of the area and therefore of the capacitance of the tunnel oxide, besides the improved characteristics of endurance to repeated write/erase cycles of the stored data, are associated other positive consequences as will be easily recognized by the expert technician.

For example, the original configuration of the cell of the invention makes it possible to reduce greatly also the capacitance $C_2$ (FIG. 2), in so far the whole floating gate results more compact, no longer needing to extend on an adequately large area over the drain region; dimensions (in the "column"direction) and/or the superimposed area of the control gate and the floating gate above the surrounding field oxide for increasing the capacitance $C_1$ may be reduced thus allowing a higher degree of integration.

The reduced criticity of the area definition operations (i.e. of the masks) will increase also the "yield" of the fabrication process.

The arrangement and connection of the single memory device, that is of the single FLOTOX cells and of the relative select transistor to form a memory line is the customary one, according to which the source regions of all the elementary cells are connected to ground, the control gates of all the cells are connected to a "program line", the gates of the select transistors are connected to a so-called "select line" and each drain terminal of the various select transistors constitutes the terminal of each "column" of the memory line.

For discharging the charge from all the elementary cells, the program lines and select lines are polarized with a sufficiently high voltage, while connecting to ground the column terminals.

To write a byte of data, the program line is connected to ground, while the columns relative to the selected byte are polarized with a high voltage or connected to ground in accordance with the data pattern, keeping the select line at a high voltage.

The preferred fabrication process for making the new memory devices of the present invention may be described by a sequence of essential process steps, illustrated hereinafter.

Over a semiconducting material of a first type of conductivity (typically a slice of monocrystalline p-doped silicon) and superficially pre-oxidized, a layer of silicon nitride is deposited.

After one proceeds to mask the active areas with photo-resist, to attack the nitride and after with the so-called field implantation; i.e. to implant acceptor type impurities in areas where will be formed the isolation structure (thick layer of field oxide) for separating the single elementary devices which must be formed on the surface of the monocrystalline silicon.

After having removed the masking material, the field oxidation is performed to grow the thick layer of silicon oxide in areas not previously covered by the silicon nitride layer. Simultaneously, the implanted dopant diffuses in the silicon in a region immediately underneath the field oxide, thus completing the formation of the isolation structure.

After having removed the silicon nitride layer and the thin layer of superficial oxide grown in said preliminary operation over the surface of the silicon single crystal, under particularly stringent conditions of absence of contaminant, a new layer of silicon oxide is grown to form the so-called gate oxide.

The first layer or level of polycrystalline silicon is thence deposited and, eventually, it is doped to increase its bulk electrical conductivity. The thickness of the first poly is preferably comprised between 4000 and 5000 Å.

A new masking operation is performed and the polycrystalline silicon layer is attacked, thus defining the edges of the first poly 1, that is of the floating gate of the memory device, along one direction.

A new photoresist mask for the so-called FLOTOX implant is formed, and impurities of a second type of conductivity (in the shown example of n-type conductivity) are implanted in the silicon to form the n+-doped regions, which will constitute, respectively, the drain and the source regions of the MOS devices.

After having removed the masking material used for the said n+ implant, a new photoresist mask (whose outline is indicated with 15 in FIG. 5) is formed and through this mask the gate silicon oxide in the area not covered by the first level of poly is attacked until exposing the underlying silicon crystal.

After having removed the residual masking material, under particularly stringent conditions of freedom from contaminants, a thin layer of silicon oxide with a thickness of about 100 Å (tunnel oxide) is thermally grown.

Over this thin layer of tunnel oxide, a first thin matrix layer of polycrystalline silicon, having a thickness of about 500 Å, is deposited.

A new photoresist mask, whose outline is indicated with 16 in FIG. 5, allows to remove, inside such a defined area, both the polycrystalline silicon of said first thin matrix layer and the underlying thin layer of tunnel oxide.

After having removed the masking material, a second matrix layer of polycrystalline silicon, having a thickness preferably comprised between 3000 and 4000 Å, is deposited.

The matrix layer of polycrystalline silicon is then subjected to anisotropic attack by RIE technique and the removal of the polycrystalline silicon is conducted until removing a thickness equivalent to the deposited thickness. As it is well known to the expert technician and representative of the so-called self-aligned fabrication processes, in correspondence to the steps determined by the presence of the underlying layer of the first level polycrystalline silicon (floating gate 1), the anisotropic attack will leave a residual seam (1b and 1a of FIGS. 5 and 6) of polycrystalline silicon belonging to said matrix layer previously deposited in a uniform way over the whole surface.

At this point, it is possible to remove the gate silicon oxide layer, formed previously, from the active areas of the device not covered by the composite structure (1+1a+1b) of the floating gate of the memory device being fabricated.

After having defined by means of an appropriate mask the edges of the composite structure of the floating gate along a direction perpendicular to that of the previously defined edges, under particularly stringent conditions of freedom from contaminants, a new layer of gate silicon oxide may be formed again over the active area not covered by the composite structure of the floating gate. Simultaneously, the insulating dielectric layer 4 may be advantageously formed for insulating, above, the floating gate. Alternately such a top insulating layer of the floating gate structure may be formed separately by means of chemical vapor deposition of silicon oxide or of an equivalent oxide.

The second level of polycrystalline silicon is deposited, and, preferably, it is doped for increasing its bulk electrical conductivity.

The fabrication process contemplates then the growth of a layer of oxide over such a second layer or level of polycrystalline silicon, the definition by means of appropriate masks of the geometries of the second level of polycrystalline silicon (of the circuitry and of the memory cells) and the attack of the second level of polycrystalline silicon.

The fabrication process will proceed then according to custom as any other polysilicon gate, CMOS or NMOS process.

The semiconductor material 2 over which are formed the distinct elementary memory devices may also be a "well" region of a certain type of conductivity (e.g. p-doped silicon in the case of the example shown) formed in a substrate of a semiconductor material of a different type of conductivity (e.g. n-doped silicon).

What I claim is:

1. An electrically alterable, nonvolatile, flowing gate type memory device, comprising a substrate (2) of semiconductor material having a channel region (9) of a first type of conductivity between a first (10) and a second region (7) of a second type of conductivity, formed at the surface of said semiconductor substrate, said channel region providing a region within the semiconductor capable of passing an electric current between said first and said second region, a first level of patterned conducting material, constituting said floating gate (1), extending over said channel region (9), substantially between said first (10) and said second region (7) and electrically insulated by means of a first layer (3) of dielectric material from said semiconductor substrate and by means of a second layer (4) of dielectric material from a second level of patterned conducting material, constituting a control gate (5), overlying said floating gate (1) and which further includes a tunnel area defined on the surface of one of said first (10) and second (7) regions of the semiconductor substrate, said tunnel area being bordered on one side by the base of a portion of the length of a side wall of said floating gate (1) and being covered with a third layer (8) of dielectric material thinner than said first layer (3) of dielectric material;

a tapered, lateral, seamlike appendix (1b) of conducting material juxtaposed along said portion of the length of the side wall of said floating gate (1), the base of said juxtaposed, tapered, lateral, seamlike appendix (1b) of conducting material abutting on the surface of said third layer (8) of dielectric material covering said tunnel area;

said seamlike appendix (1b) being electrically connected to said patterned first level of conducting material constituting said floating gate (1).

2. The memory device according to claim 1, wherein said channel region is of p-doped silicon, said first and said second region are of n+ doped silicon and said appendix is superimposed relative to a drain region of the device.

3. The memory device according to claim 1, wherein said patterned first (1) and said second (5) levels and said seamlike tapered appendix (1b) of conducting material are made of doped polycrystalline silicon.

4. The memory device according to claim 1, wherein said first or gate layer (3) of dielectric material is a layer of silicon oxide having a thickness comprised between 300 and 500 Angstroms.

5. The memory device according to claim 1, wherein said third or tunnel layer (8) of dielectric material is a layer of silicon oxide having a thickness lower than 100 Angstroms.

6. The memory device according to claim 1, wherein said appendix is of polycrystalline silicon and is obtained by anisotropically attacking a layer of polycrystalline silicon of uniform thickness, previously deposited over at least a portion of the surface of said semiconductor chip.

7. The memory device according to claim 1, wherein said channel region and said first and said second region are all contained within a "well" region of said first type of conductivity, formed in a substrate of semiconducting material of a second type of conductivity.

8. The memory device according to claim 1, and comprising a plurality of said memory devices arranged in an addressable array of lines and columns on the semiconductor chip.

9. The memory device according to claim 8, wherein to each device of said plurality is associated, in series with the same, a select MOS transistor.

10. The memory device according to claim 9, wherein the control gate of all said floating gate type memory devices belonging to each line are connected to a single program line and all the gates of the relative select transistors are connected to a single select line.

11. The memory device according to claim 1, wherein said seamlike appendix (1b) is juxtaposed along said side wall of said floating gate (1) and is separated therefrom by an insulating layer (8) for a length of the side equal to said portion of the length of the side wall of said floating gate (1); said conducting seamlike appendix (1b) continuing, without discontinuities, around the entire perimeter of said patterned conducting material constituting said floating gate (1) and directly abutting on the side wall thereof and in electrical continuity thereto along portions of said perimeter outside said portion of the length of the side wall.

* * * * *